United States Patent
Li et al.

(10) Patent No.: US 12,224,777 B1
(45) Date of Patent: *Feb. 11, 2025

(54) SYSTEMS AND METHODS FOR NEURAL NETWORK BASED DATA COMPRESSION

(71) Applicant: AtomBeam Technologies Inc., Moraga, CA (US)

(72) Inventors: Zhu Li, Overland Park, KS (US); Paras Maharjan, Kansas City, MO (US); Brian Galvin, Silverdale, WA (US)

(73) Assignee: ATOMBEAM TECHNOLOGIES INC, Moraga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/907,442

(22) Filed: Oct. 4, 2024

Related U.S. Application Data

(63) Continuation-in-part of application No. 18/885,741, filed on Sep. 16, 2024, which is a continuation-in-part of application No. 18/792,542, filed on Aug. 1, 2024, and a continuation-in-part of application No. 18/648,340, filed on Apr. 27, 2024, which is a continuation-in-part of application No. 18/427,716, filed on Jan. 30, 2024, now Pat. No. 12,093,972, which is a continuation-in-part of application No. 18/410,980, filed on Jan. 11, 2024, now Pat. No. 12,068,761, which is a continuation-in-part of (Continued)

(51) Int. Cl.
*H03M 7/30* (2006.01)

(52) U.S. Cl.
CPC ....... *H03M 7/3064* (2013.01); *H03M 7/6011* (2013.01)

(58) Field of Classification Search
CPC .................. H03M 7/3064; H03M 7/6011
USPC ....................................... 341/50, 51
See application file for complete search history.

(56) References Cited

U.S. PATENT DOCUMENTS

| 7,629,922 B2 | 12/2009 | Winstead et al. |
| 7,876,257 B2 | 1/2011 | Vetro et al. |

(Continued)

OTHER PUBLICATIONS

Cai, Yuanhao et al., "Mask-guided Spectral-wise Transformer for Efficient Hyperspectral Image Reconstruction", Conference on Computer Vision and Pattern Recognition, pp. 17502-17511, 2022.

(Continued)

*Primary Examiner* — Jean B Jeanglaude
(74) *Attorney, Agent, or Firm* — Galvin Patent Law LLC; Brian R. Galvin

(57) ABSTRACT

For compressing data, preprocessing operations are performed on raw input data. A discrete cosine transform is performed on the preprocessed data, and multiple subbands are created, where each subband represents a particular range of frequencies. The subbands are organized into multiple groups, where the multiple groups comprise a first low frequency group, a second low frequency group, and a high frequency group. A latent space representation is generated corresponding to each of the multiple groups of subbands. A first bitstream is created based on the latent space representation, and an alternate representation of the latent space is used for creating a second bitstream, enabling multiple-pass techniques for data compression. The multiple bitstreams may be multiplexed to form a combined bitstream for storage and/or transmission purposes.

20 Claims, 7 Drawing Sheets

Related U.S. Application Data application No. 18/537,728, filed on Dec. 12, 2023, now Pat. No. 12,058,333.

(56) References Cited

U.S. PATENT DOCUMENTS

| | | |
|---|---|---|
| 11,656,353 B2 | 5/2023 | Li et al. |
| 11,915,690 B1 | 2/2024 | Chang et al. |
| 2019/0034781 A1* | 1/2019 | Asano .................. G06N 5/04 |
| 2020/0404340 A1 | 12/2020 | Xu et al. |
| 2022/0246158 A1 | 8/2022 | Nam et al. |

OTHER PUBLICATIONS

Cai, Yuanhao; et al., "MST++: Multi-stage Spectral-wise Transformer for Efficient Spectral Reconstruction", Conference on Computer Vision and Pattern Recognition, 2022.
He, Kaiming; Zhang, Xiangyu; Ren, Shaoqing; Sun, Jian; Microsoft Research, "Deep Residual Learning for Image Recognition", Conference on Computer Vision and Pattern Recognition, pp. 770-778, 2016.

* cited by examiner

SYSTEMS AND METHODS FOR NEURAL NETWORK BASED DATA COMPRESSION

CROSS-REFERENCE TO RELATED APPLICATIONS

Priority is claimed in the application data sheet to the following patents or patent applications, each of which is expressly incorporated herein by reference in its entirety:
Ser. No. 18/885,741
Ser. No. 18/792,542
Ser. No. 18/648,340
Ser. No. 18/427,716
Ser. No. 18/410,980
Ser. No. 18/537,728

BACKGROUND OF THE INVENTION

Field of the Art

The present invention is in the field of data processing, and more particularly is directed to the field of data compression.

Discussion of the State of the Art

Data compression is a fundamental technology in computer applications that plays a critical role in enhancing performance, efficiency, and user experience. Data compression involves reducing the size of data files or streams without significantly compromising their quality, which leads to numerous benefits across various domains. Since compressed data requires less storage space than uncompressed data, it allows more data to be stored on the same device or server. Additionally, data compression can reduce costs associated with storage infrastructure, especially in large-scale data centers, as well as help to optimize the use of limited storage resources on mobile devices and IoT devices and sensors.

Data compression also provides advantages regarding network utilization, as smaller file sizes can result in shorter upload and download times over networks. Thus, data compression can improve website load times and responsiveness by reducing the size of web pages, images, and videos. Moreover, data compression can enhance streaming quality and reduce buffering during use of online media services (e.g., Netflix, YouTube). Additionally, data compression leads to cost reductions in storage, bandwidth, and hardware, by reducing the need for purchasing additional storage hardware, and reducing operational costs for maintaining large-scale storage systems and data centers.

Thus, data compression is essential for optimizing the use of storage, network, and processing resources. Data compression plays a pivotal role in enhancing the performance of various computer applications, reducing costs, improving user experience, and enabling the scalability of emerging technologies. By efficiently managing data, compression techniques help maintain a balance between the increasing demand for digital content and the available infrastructure, making it a key component of modern computing and communication systems.

SUMMARY OF THE INVENTION

Accordingly, there is disclosed herein, systems and methods for compressing and decompressing data. Disclosed embodiments provide efficient techniques for compression and decompression that utilize a multi-pass neural network. Many types of data have patterns that can be exploited for efficient data compression. Disclosed embodiments utilize machine learning systems and techniques to find patterns in data that can be exploited for data compression purposes. One or more embodiments provide models that can learn representations of data that capture underlying patterns and structures, which are then used to compress the data efficiently. Embodiments can include the use of autoencoders, which can be trained and/or configured to encode input data into a smaller, latent space representation (e.g., using one or more bottleneck layers) and then reconstruct the data from this representation. The compressed representation can be stored or transmitted, and the decoder reconstructs the original data. One or more embodiments an utilize a variational autoencoder (VAE) that learns probabilistic latent variable models, which helps in generating compressed representations with some randomness and better handling of variability in data. One or more embodiments may utilize a Generative Adversarial Network (GAN) that is trained to generate compressed versions of data by learning the distribution of the data. The generator network portion of the GAN creates compressed representations, while the discriminator network portion of the GAN helps refine these representations One or more embodiments may utilize a recurrent neural network (RNN) for identifying temporal patterns and dependencies, enabling efficient compression of time-series data by predicting future values based on past data. One or more embodiments may perform pattern recognition and/or feature extraction. Embodiments may utilize a convolutional neural network CNN) to detect and extract features, such as edges, shapes, and/or textures within an image. One or more embodiments may utilize a context-based model that can understand the context of data and predict what data is likely to come next, allowing for efficient encoding based on prediction errors. Moreover, disclosed embodiments are well-suited for parallelization for execution on a multi-core system and/or FPGA (field-programmable gate array) or ASIC (application specific integrated circuit) based system.

According to a preferred embodiment, there is a system for data compression, comprising: a computing device comprising at least a memory and a processor; a preprocessing subsystem comprising a first plurality of programming instructions that, when operating on the processor, cause the computing device to perform one or more preprocessing operations on an uncompressed dataset; a discrete cosine transform (DCT) subsystem comprising a second plurality of programming instructions that, when operating on the processor, cause the computing device to: perform a DCT operation on the uncompressed dataset, and create a plurality of subbands for the uncompressed dataset, wherein each subband represents a frequency range; and divide the plurality of subbands into multiple groups, wherein the multiple groups comprise a first low frequency group, a second low frequency group, and a high frequency group; a compression subsystem comprising a third plurality of programming instructions that, when operating on the processor, cause the computing device to implement a latent feature encoding network, wherein the latent feature encoding network comprises: a first kernel, the first kernel configured to provide output to a first plurality of residual blocks, the first plurality of residual blocks configured to provide output to a first attention network, the first attention network configured to provide output to a second plurality of residual blocks, the second plurality of residual blocks configured to provide output to a second kernel, and the second kernel configured to provide output to a second attention network, and wherein the latent feature encoding network is configured and disposed to generate a latent space representation corresponding to the uncompressed dataset; a first arithmetic coding subsystem comprising a fourth plurality of programming instructions that, when operating on the processor, cause the computing device to perform compression on one or more of the plurality of subbands, thereby creating a first compressed bitstream; a hyperprior latent feature summarization module configured and disposed to receive input from the second attention network, and provide a refined and disentangled representation of one or more latent features as output; and a second arithmetic coding subsystem comprising a fifth plurality of programming instructions that, when operating on the processor, cause the computing device to perform compression on the output of the hyperprior latent feature summarization module, thereby creating a second compressed bitstream, wherein the first compressed bitstream and second compressed bitstream together represent a compressed version of the uncompressed dataset.

According to another preferred embodiment, there is provided a method for data compression, comprising: performing one or more preprocessing operations on an uncompressed dataset; performing a discrete cosine transform (DCT) operation on the uncompressed dataset, and create a plurality of subbands for the uncompressed dataset, wherein each subband represents a frequency range; dividing the plurality of subbands into multiple groups, wherein the multiple groups comprise a first low frequency group, a second low frequency group, and a high frequency group; generating a latent space representation corresponding to the multiple groups; generating a refined and disentangled representation of one or more latent features utilizing hyperprior latent feature summarization; creating a first compressed bitstream based on the latent space representation; and creating a second compressed bitstream based on output of the hyperprior latent feature summarization; wherein the first compressed bitstream and second compressed bitstream together represent a compressed version of the uncompressed dataset.

According to an aspect of an embodiment, it further includes computing a thumbnail version of the latent space representation.

According to an aspect of an embodiment, the hyperprior latent feature summarization module comprises a Hierarchical Bayesian Network (HBN).

According to an aspect of an embodiment, the first kernel is configured to have five channels and a stride value of 1.

According to an aspect of an embodiment, the second kernel is configured to have five channels and a stride value of 2.

According to an aspect of an embodiment, the first plurality of residual blocks comprises six residual blocks.

According to an aspect of an embodiment, the second plurality of residual blocks comprises three residual blocks.

According to an aspect of an embodiment, the system further comprises a bitstream multiplexor, wherein the bitstream multiplexor is configured to receive as input, the first compressed bitstream and the second compressed bitstream, and output a third compressed bitstream, wherein the third compressed bitstream comprises data from the first compressed bitstream and the second compressed bitstream.

According to an aspect of an embodiment, the one or more preprocessing operations includes a data normalization process.

According to an aspect of an embodiment, the one or more preprocessing operations includes a quantization process.

According to an aspect of an embodiment, the one or more preprocessing operations includes a noise reduction process.

According to an aspect of an embodiment, the one or more preprocessing operations includes an outlier reduction process.

According to an aspect of an embodiment, it further includes multiplexing the first compressed bitstream and the second compressed bitstream to form a third compressed bitstream.

According to an aspect of an embodiment, the compression subsystem further causes the processor to discard one or more subbands prior to generating the latent space representation.

According to an aspect of an embodiment, there is provided a non-transient, computer-readable medium comprising programming instructions for an electronic computation device executable by a processor to cause the electronic computation device to: perform one or more preprocessing operations on an uncompressed dataset; perform a discrete cosine transform (DCT) operation on the uncompressed dataset, and create a plurality of subbands for the uncompressed dataset, wherein each subband represents a frequency range; divide the plurality of subbands into multiple groups, wherein the multiple groups comprise a first low frequency group, a second low frequency group, and a high frequency group; generate a latent space representation corresponding to the multiple groups; generate a refined and disentangled representation of one or more latent features utilizing hyperprior latent feature summarization; create a first compressed bitstream based on the latent space representation; and create a second compressed bitstream based on output of the hyperprior latent feature summarization; wherein the first compressed bitstream and second compressed bitstream together represent a compressed version of the uncompressed dataset.

BRIEF DESCRIPTION OF THE DRAWING FIGURES

Figure 1:
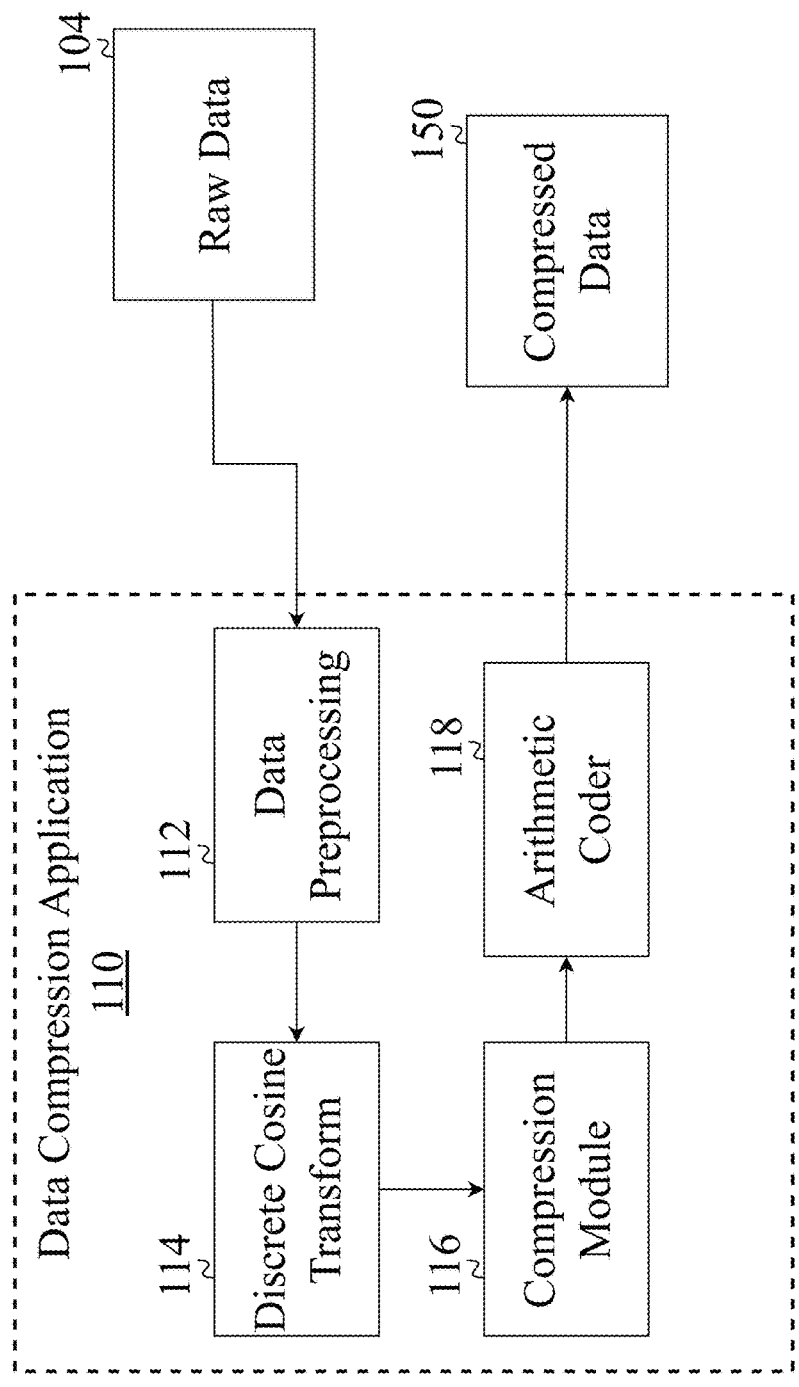
FIG. 1 is a block diagram illustrating an exemplary system architecture for compressing uncompressed data, according to an embodiment.

The drawings are not necessarily to scale. The drawings are merely schematic representations, not intended to portray specific parameters of the disclosed embodiments. The drawings are intended to depict only typical embodiments of the invention, and therefore should not be considered as limiting in scope.

DETAILED DESCRIPTION OF THE INVENTION

Sending and/or storing large amounts of data can pose several challenges. Limited available bandwidth can restrict the rate at which data can be transmitted, especially for satellite communication where bandwidth is shared among multiple users. High latency in communication links can delay the transmission of data, which may be critical for real-time applications. Transmitting large amounts of data requires more power, which can be a limitation for some data sources, such as battery-powered sensors or satellites. Furthermore, transmitting large amounts of data over long distances can be costly due to bandwidth charges and other fees. Additionally, storing large amounts of digital data can be challenging and may require efficient storage solutions.

Disclosed embodiments enable efficient data compression by utilizing machine learning systems and techniques to find patterns in data that can be exploited for data compression purposes. One or more embodiments provide models that can learn representations of data that capture underlying patterns and structures, which are then used to compress the data efficiently. Embodiments can include the use of autoencoders, which can be trained and/or configured to encode input data into a smaller, latent space representation (e.g., using one or more bottleneck layers) and then reconstruct the data from this representation. The compressed representation can be stored or transmitted, and the decoder reconstructs the original data. One or more embodiments an utilize a variational autoencoder (VAE) that learns probabilistic latent variable models, which helps in generating compressed representations with some randomness and better handling of variability in data. One or more embodiments may utilize a Generative Adversarial Network (GAN) that is trained to generate compressed versions of data by learning the distribution of the data. The generator network portion of the GAN creates compressed representations, while the discriminator network portion of the GAN helps refine these representations. One or more embodiments may utilize a multi-pass neural network in which multiple passes over the latent space is performed, creating a thumbnail version of the latent space. This process can be repeated multiple times, such that latent space (x) is a thumbnail representation of latent space (x−1). For each pass, a latent space bitstream is generated. In one or more embodiments, each latent space bitstream is multiplexed together to form a combined bitstream. The combined bitstream is well-suited for communication via a communications channel such as a wireless transmission protocol. Moreover, disclosed embodiments provide techniques that are well-suited for hardware acceleration and implementable on efficient, scalable hardware such as multi-GPU (Graphics Processing Unit) processors and/or FPGA-based systems.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing subsystems, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "neural network" refers to a computer system modeled after the network of neurons found in a human brain. The neural network is composed of interconnected nodes, called artificial neurons or units, that work together to process complex information.

The term "bitstream" refers to a binary sequence of data representing the compressed version of input data.

The term "autoencoder" refers to a type of neural network architecture that can learn compact representations of data.

Conceptual Architecture

FIG. 1 is a block diagram illustrating an exemplary system architecture for compressing raw digital data (raw data). The raw data can include binary data, represented as a series of 0s and 1s. The raw data can be uncompressed data. According to an embodiment, raw data 104 is input to the data compression application 110. The raw data 104 can include video data, audio data, telemetry data, analog signal data, image data, radar data, IoT sensor data, and/or other suitable type of data.

The data compression application 110 can include a data preprocessing subsystem 112. The data preprocessing subsystem 112 can perform one or more operations on the raw data 104. The preprocessing can include a data normalization process. In embodiments, the data normalization process can be used to adjust the scale or distribution of data to make it consistent and comparable across different datasets or features. In embodiments, the normalization can be used to ensure that each feature contributes properly to the model's training process or for improving the efficiency of data compression algorithms. In one or more embodiments, the normalization can include Min-Max normalization, decimal scaling, logarithmic transformation, unit vector normalization, and/or Z-score normalization. Normalizing data before compression offers several advantages that enhance both the efficiency and quality of the compression process. Normalized data can have less variability and be more uniformly distributed, which can improve the ability of compression algorithms to identify patterns and redundancies, thereby potentially resulting in higher compression ratios, improved storage and transmission efficiency, and/or better performance of machine learning models.

The preprocessing can include a quantization process. In embodiments, the data quantization process can be used to reduce the number of bits needed to represent information by approximating values with a limited set of discrete levels. The data quantization process can convert a continuous range of values into a finite set of levels, which can then be encoded more compactly. Embodiments can include dividing the range of input values into intervals (or bins), each associated with a quantization level. The size of these intervals is determined by the quantization resolution. One or more embodiments may utilize uniform quantization, in which intervals between levels are equally spaced. Alternatively, one or more embodiments may utilize non-uniform quantization, in which intervals are not equally spaced, and more levels are assigned to ranges with higher data density (e.g., using logarithmic spacing).

The preprocessing can include a noise reduction process. In embodiments, the noise reduction process can be used to remove or reduce unwanted disturbances from the input signal. This process enhances the quality and accuracy of the data by filtering out irrelevant or extraneous information that can interfere with subsequent processing tasks, such as compression, analysis, or transmission. One or more embodiments can include low-pass filters, high-pass filters, band-pass filters, notch filters, median filters, and/or other suitable types of filters. One or more embodiments can utilize a machine learning model that is trained to identify and remove noise. Thus, embodiments can identify complex patterns of noise that traditional filters might miss.

The preprocessing can include an outlier reduction process. In embodiments, the outlier reduction process can be used to identify and handle extreme values that deviate significantly from the majority of the data. Outliers can arise due to various reasons, including measurement errors, data entry mistakes, or genuine but rare occurrences. These extreme values can distort analysis, modeling, and data compression results. One or more embodiments can perform outlier reduction by utilizing a Z-score method, interquartile range (IQR) method, Euclidian distance technique, and/or other suitable techniques.

The preprocessed data is input to discrete cosine transform (DCT) subsystem 114. The Discrete Cosine Transform (DCT) is a mathematical technique well-suited for signal and/or image processing. The DCT represents data, such as an image, as a sum of sinusoids with varying magnitudes and frequencies. The discrete cosine transform subsystem 114 is configured to compute the two-dimensional DCT of an image, capturing essential features. In embodiments, the input image is divided into blocks (e.g., 8-by-8 or 16-by-16), and a DCT is computed for each block, yielding coefficients that are used as part of the compression/decompression process.

The output of the discrete cosine transform (DCT) subsystem 114 is input to the compression subsystem 116. The compression subsystem 116 is configured to implement a latent feature learning block, wherein the latent feature learning block is configured and disposed to generate a latent space representation corresponding to the multiple groups of subbands. In embodiments, the subbands include a DC subband, and one or more AC subbands, where each AC subband represents a frequency range. In embodiments, a DC subband and 15 AC subbands are used, for a total of 16 subbands (i.e., 16 channels).

The compression subsystem 116 may further perform subband grouping. The subband grouping can include grouping subbands into a high frequency (HF) group, and one or more low frequency (LF) groups. In embodiments, the compression subsystem 116 groups the subbands into two low frequency groups (LF1, and LF2), and a high frequency group (HF). In one or more embodiments, one or more subbands may be discarded. In embodiments, the discarding includes discarding one or more subbands in the high frequency group, as those subbands often do not contain large amounts of meaningful information that is beneficial for data compression purposes. Accordingly, discarding one or more subbands can help improve the compression ratio when compressing raw data 104. The compression subsystem 116 may further include a neural network to process each subband individually. The neural network can include an autoencoder, an implicit neural representation (INR), a deep learning neural network, and/or other suitable neural network. In embodiments, the compression subsystem 116 comprises programming instructions that when operating on the processor, cause the processor to discard one or more subbands prior to generating the latent space representation. In embodiments, the compression subsystem 116 further comprises programming instructions that when operating on the processor, cause the processor to implement a context network, wherein the context network is configured to compute a thumbnail version of the latent space representation. In embodiments, the compression subsystem further comprises programming instructions that when operating on the processor, cause the processor to implement a multi-stage context recovery subsystem, wherein the multi-stage context recovery subsystem comprises a first loss function associated with the first low frequency group, a second loss function associated with the second low frequency group, and a third loss function associated with the high frequency group. In embodiments, at least one of the first loss function, second loss function, and third loss function is based on a weighting scheme. In embodiments, at least one of the first loss function, second loss function, and third loss function is optimized for data compression and/or decompression.

The output of the compression subsystem 116 can be input to arithmetic coder subsystem 118. In embodiments, the arithmetic coder subsystem 118 is configured to represent a string of characters using a single fractional number between 0.0 and 1.0. Frequently occurring symbols are stored with fewer bits, while rare symbols use more bits. In one or more embodiments, the arithmetic coder subsystem 118 can implement adaptive arithmetic coding, in which case the arithmetic coder subsystem 118 adapts to changing probabilities during the encoding process. The output of the arithmetic coder subsystem 118 can serve as a compressed data file 150. A compressed data file such as compressed data file 150 can be efficiently stored and/or transmitted via a radio communications channel or other suitable communications network, to a receiving device, where it can then be decompressed using corresponding decompression techniques.

Figure 2:
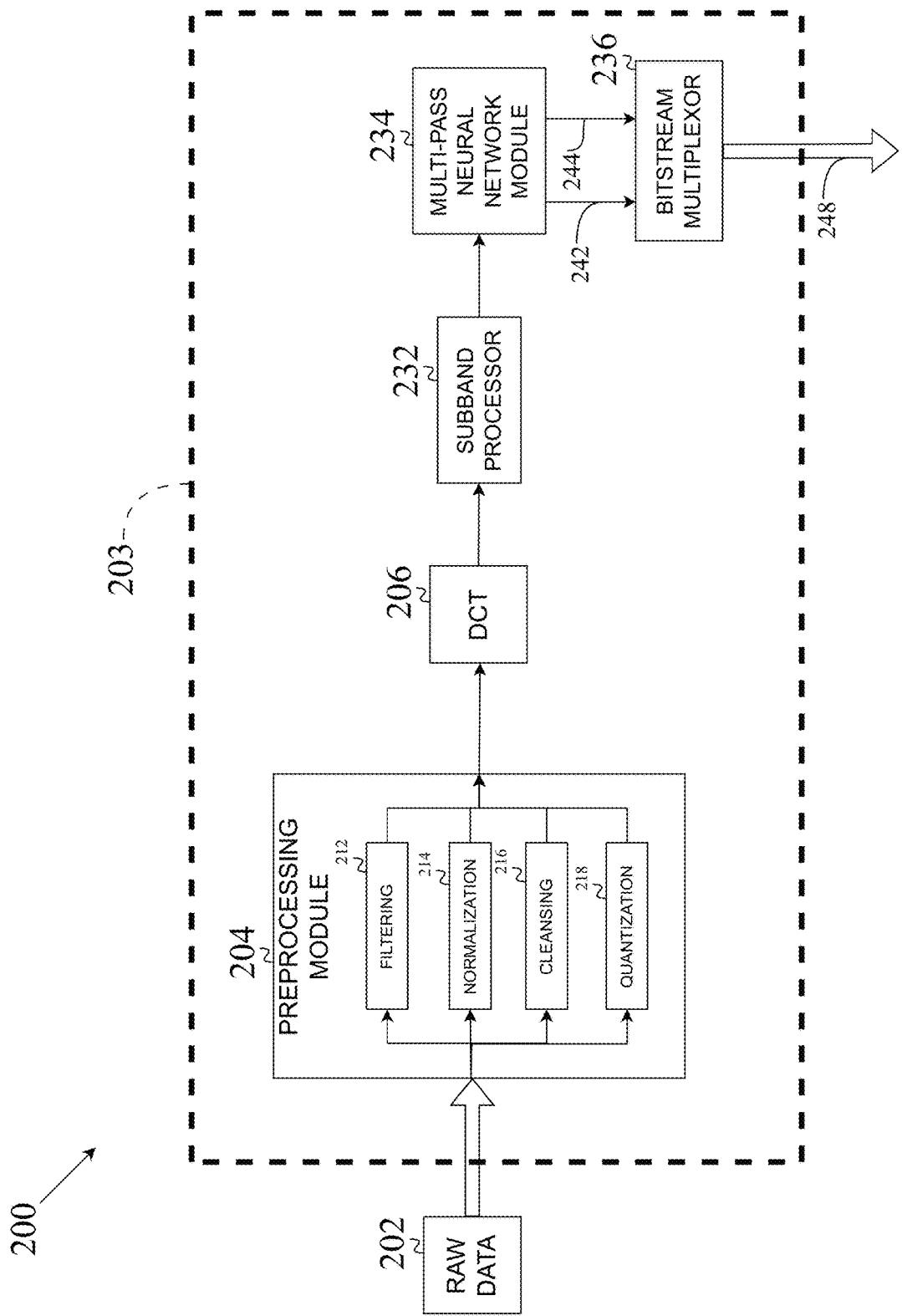
FIG. 2 is a block diagram showing details of an implementation for compressing uncompressed data with a multi-pass neural network module, according to an embodiment.

FIG. 2 is a block diagram 200 showing details of an implementation for compressing uncompressed data with a multi-pass neural network module, according to an embodiment. Raw data 202 is input to data compression system 203. Data compression system 203 includes preprocessing module 204. Preprocessing module 204 can include one or more submodules that provide functionality that may be applied sequentially or concurrently to the input raw data 202. The submodules can include a filtering submodule 212. The filtering submodule 212 can include functions and instructions, that when executed by the processor of a computing device, cause the computing device to perform one or more filtering operations. The filtering operations can include low-pass filtering, high-pass filtering, bandpass filtering, notch filtering, and/or other suitable types of filtering. The submodules can include a normalization submodule 214.

The normalization submodule 214 can include functions and instructions, that when executed by the processor of a computing device, cause the computing device to perform one or more normalizing operations. The normalizing operations can include Min-Max normalization, decimal scaling, logarithmic transformation, unit vector normalization, Z-score normalization, and/or other suitable types of normalization. The submodules can include a cleansing submodule 216. The cleansing submodule 216 can include functions and instructions, that when executed by the processor of a computing device, cause the computing device to perform one or more cleansing operations. The cleansing operations can include performing data integrity checks, interpolation, extrapolation, estimating missing data points, deleting outlier data points, and/or other suitable types of data cleansing. The submodules can include a quantization submodule 218. The quantization submodule 218 can include functions and instructions, that when executed by the processor of a computing device, cause the computing device to perform one or more quantization operations. The quantization operations can include linear quantization, non-linear quantization, logarithmic quantization, and/or other suitable types of data quantization.

One or more preprocessing operations may be performed sequentially. In embodiments, the input raw data 202 is first processed by the cleansing submodule 216, followed by the normalization submodule 214, and then the filtering submodule 212. In some embodiments, the raw data 202 may be an analog signal that is quantized by the quantization submodule 218. In some embodiments, the raw data 202 may be a digital signal that is re-quantized by the quantization submodule 218. The re-quantization can serve to reduce the size of the data to be stores, enabling more efficient storage or transmission. In embodiments, the re-quantization can include lowering the bit depth, thereby reducing the amount of data required to represent the signal. Furthermore, the re-quantization of disclosed embodiments can help reduce the impact of noise in a digital signal. In cases where a signal has been corrupted by noise or transmission errors, re-quantizing to a lower bit depth can sometimes mask the noise, improving perceived quality.

The output of the preprocessing module 204 is then input to a discrete cosine transform (DCT) module 206. The DCT module 206 can partition data into blocks, and process each block, transforming data values, such as pixel values, into frequency components. The frequency components are then input to subband processor 232. The subband processor 232 can group frequency components into one or more subbands. The subbands that have little to no contribution to the original data can be removed, thereby enabling an effective lossy compression feature of disclosed embodiments. The remaining subbands that were not removed are then input to multi-pass neural network module 234. The multi-pass neural network module 234 can be configured to create latent spaces through multiple passes. A first latent space can be created from the data provided by subband processor 232. Then a second latent space can be created based on the first latent space. This process can be repeated for multiple passes. In general, there can be latent space (0), latent space (1) ... latent space (X−1), latent space (X), and so on. Latent space (X) is based on latent space (X−1), which is based on latent space (X−2), and so on. Latent space (0) is the special case of the initial latent space based on the data provided by subband processor 232.

Latent spaces can serve as a compressed representation of the input data, capturing the key features without storing all the original information. Thus, disclosed embodiments can enable efficient storage and transmission of data, especially in scenarios like image compression, where the latent space of an autoencoder effectively compresses image data. In embodiments, a latent space might capture features at one level of abstraction, and further processing in another latent space can capture higher-level abstractions. Embodiments may utilize Hierarchical variational autoencoders and/or deep generative models that use multiple levels of latent spaces to capture different levels of abstraction in data. In embodiments, for an image compression application, the first latent space might represent basic features (such as edges and textures in an image), while a second latent space could represent more abstract concepts (such as objects or scenes).

Each latent space created by multi-pass neural network module 234 is converted to a bitstream that is well suited for serial communication, and/or storage. The multiple bitstreams, indicated as 242 and 244 are input to bitstream multiplexor 236. While two bitstreams are shown in FIG. 2, in practice, there can be more than two bitstreams provided to bitstream multiplexor 236. Bitstream multiplexor 236 multiplexes the multiple bitstreams into a single bitstream that can be used for input to storage systems and/or communication systems and/or communication networks. In one or more embodiments, the bitstream multiplexor 236 is a computerized component that includes a dedicated processor. In one or more embodiments, the bitstream multiplexor 236 is configured to perform time division multiplexing (TDM). In embodiments, each input bitstream is assigned a specific time slot during which its data is included in the output bitstream 248. The multiplexer cycles through the input bitstreams sequentially, sending bits from each in their designated time slots. The output bitstream 248 contains interleaved data from all inputs. In one or more embodiments, the bitstream multiplexor is configured to perform dynamic multiplexing. With the dynamic multiplexing embodiments, instead of fixed time slots, the multiplexer allocates slots dynamically based on the availability of data. This can lead to more efficient use of bandwidth as empty time slots are minimized for bitstreams that produce less data, such as higher numbered passes of latent space creation. In this way, the larger latent spaces (e.g., latent space (0), and latent space (1)) can receive more timeslots than smaller latent spaces (e.g., latent space (4), and latent space (5)). In embodiments, the multiple input bitstreams may be packetized by the bitstream multiplexor 236. In embodiments, each packet may include a header indicating which latent space the packet belongs to, as well as a packet identification number to indicate a position within the bitstream that a given packet corresponds to. In this way, the multiple bitstreams can be reconstructed as part of a decoding/decompression process to reconstruct the raw data 202. Embodiments can include a bitstream multiplexor, where the bitstream multiplexor is configured to receive as input, the first compressed bitstream and the second compressed bitstream, and output a third compressed bitstream, where the third compressed bitstream comprises data from the first compressed bitstream and the second compressed bitstream.

Figure 3:
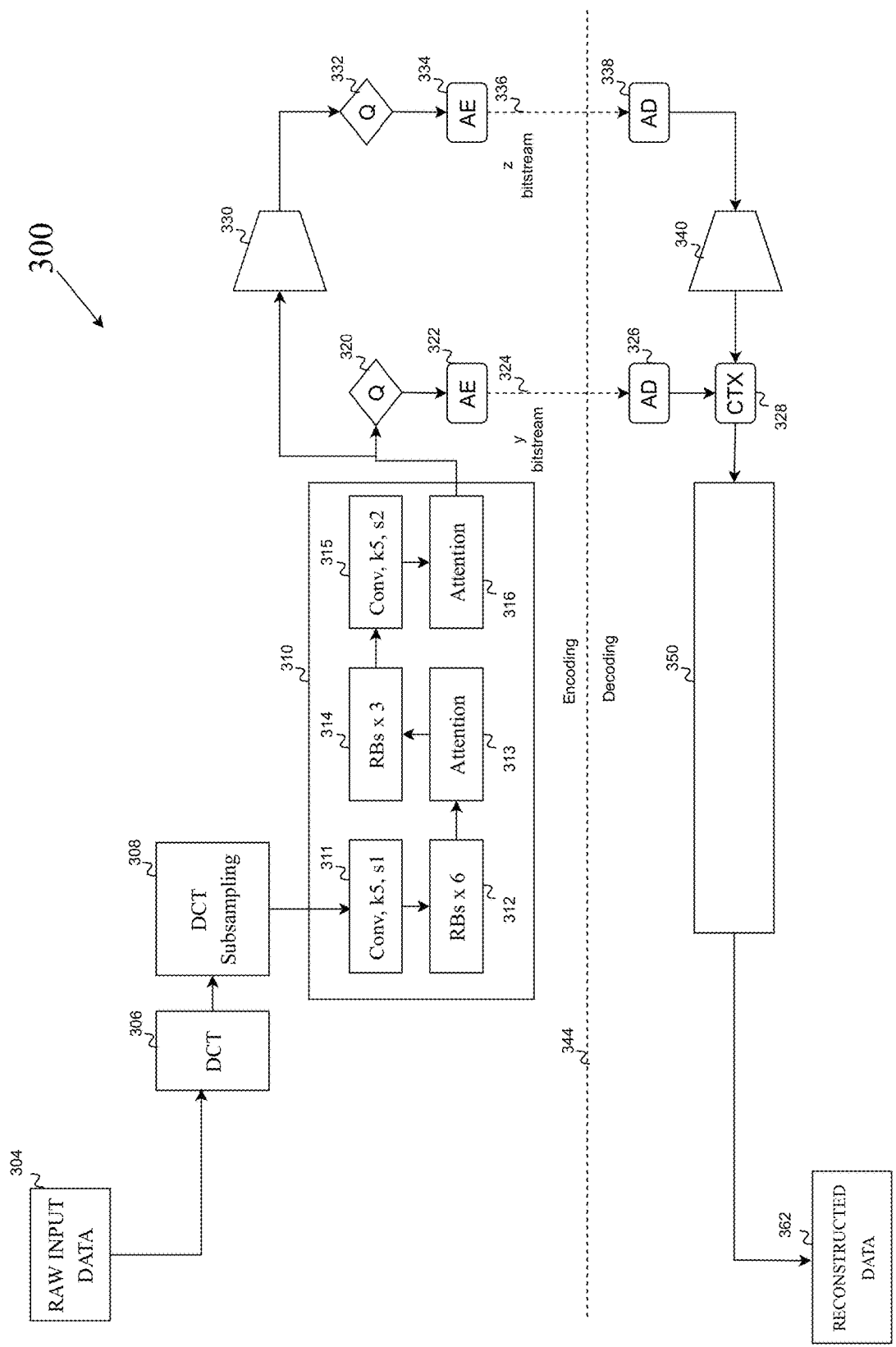
FIG. 3 is a block diagram illustrating an end-to-end architecture for data compression, according to an embodiment.

FIG. 3 is a block diagram illustrating an end-to-end architecture for data compression, according to an embodiment. The architecture 300 receives as input, a raw input data 304 that is input to a DCT block 306. The output of the DCT block 306 is input to DCT subsampling module 308. The output of the DCT subsampling module 308 is input to a compression neural network 310. The compression neural network 310 can include multiple components. In the architecture 300, data input to the compression neural network 310 is routed to convolutional neural network 311. In one or more embodiments, the convolutional neural network 311 has a kernel size of five channels and a stride of 1. In one or more embodiments, the first kernel is configured to have five channels and a stride value of 1. The output of the convolutional neural network 311 is input to first residual block array 312. Residual block array 312 may include a plurality of residual blocks. In one or more embodiments, the first plurality of residual blocks comprises six residual blocks. In one or more embodiments, the residual blocks may be used to mitigate the vanishing gradient problem and improve training efficiency. In embodiments, the residual blocks may include one or more convolutional layers, batch normalization layers, and/or activation functions such as ReLU, softmax, sigmoid, swish, leaky ReLU, and/or other suitable activation functions.

The output of residual block array 312 is input to attention mechanism 313. The attention mechanism can include a query (Q) that represents a vector used to query the relevant information from the data, a key (K) that represents a vector that the query is compared against to determine relevance, and a value (V) that represents a vector containing the actual information or data to be used. In one or more embodiments, attention scores are generated, based on a dot product of the query and key vectors. The attention mechanism may also provide normalization, such as via a softmax function, or other suitable technique.

The output of the attention mechanism 313 is provided to a second residual block array 314. Residual block array 314 may include a plurality of residual blocks. In one or more embodiments, the second plurality of residual blocks comprises three residual blocks. The output of residual block array 314 is input to a second convolutional neural network 315. In one or more embodiments, the convolutional neural network 315 has a kernel size of five channels and a stride of 2. In one or more embodiments, the second kernel is configured to have five channels and a stride value of 2. The output of the convolutional neural network 315 is input to second attention network 316. The output of second attention network 316 can serve as the final stage of the compression neural network 310. The output of the compression neural network 310 can be input to a quantizer module 320. The output of the quantizer module 320 is input to arithmetic encoder 322, to create a first bitstream 324, referred to as the 'y bitstream.'

Additionally, the output of the compression neural network 310 can be input to hyperprior latent feature summarization module 330. The hyperprior latent feature summarization module 330 can be used to implement a hierarchical Bayesian approach to improve the representation and disentanglement of latent features. The latent features can include compressed representations of data that capture essential characteristics of the raw input data 304. The summarization can include extracting and representing the most important features from the latent space. The output of the hyperprior latent feature summarization module 330 can be input to a quantizer module 332. The output of the quantizer module 332 is input to arithmetic encoder 334, to create a second bitstream 336, referred to as the 'z bitstream.' While two bitstreams (324, 326) are shown in FIG. 3, in practice, there can be more than two bitstreams in some embodiments.

Components shown below line 344 are used in decoding (decompressing) compressed data. In one or more embodiments, the components above line 344 may reside at the source of the raw input data acquisition. In one or more embodiments, the components below line 344 may reside at a destination where the compressed data is received. For decoding, the bitstream 324 is input to arithmetic decoder 326, while the bitstream 336 is input to arithmetic decoder 338. In one or more embodiments, the multiple bitstreams may be fed through a bitstream multiplexor, such as shown at 236 in FIG. 2, and then demultiplexed by a corresponding bitstream demultiplexer at the destination device for decompressing the data. The output of the arithmetic decoder 326 is input to context model (CTX) 328. The context model 328 can perform grouping of latent features into distinct groups according to their energy. The context model 328 can serve to optimize the decoding process by enabling reuse of decoded latent feature elements in context modeling. The output of arithmetic decoder 338 is input to the hyperprior latent feature summarization module 340. The output of the hyperprior latent feature summarization module 340 is input to context model (CTX) 328. The output of context model 328 is input to decompression neural network 350 which may include components similar to those described for compression neural network 310, and trained for the task of decompression. The output of the decompression neural network 350 is reconstructed data 362.

Detailed Description of Exemplary Aspects

Figure 4:
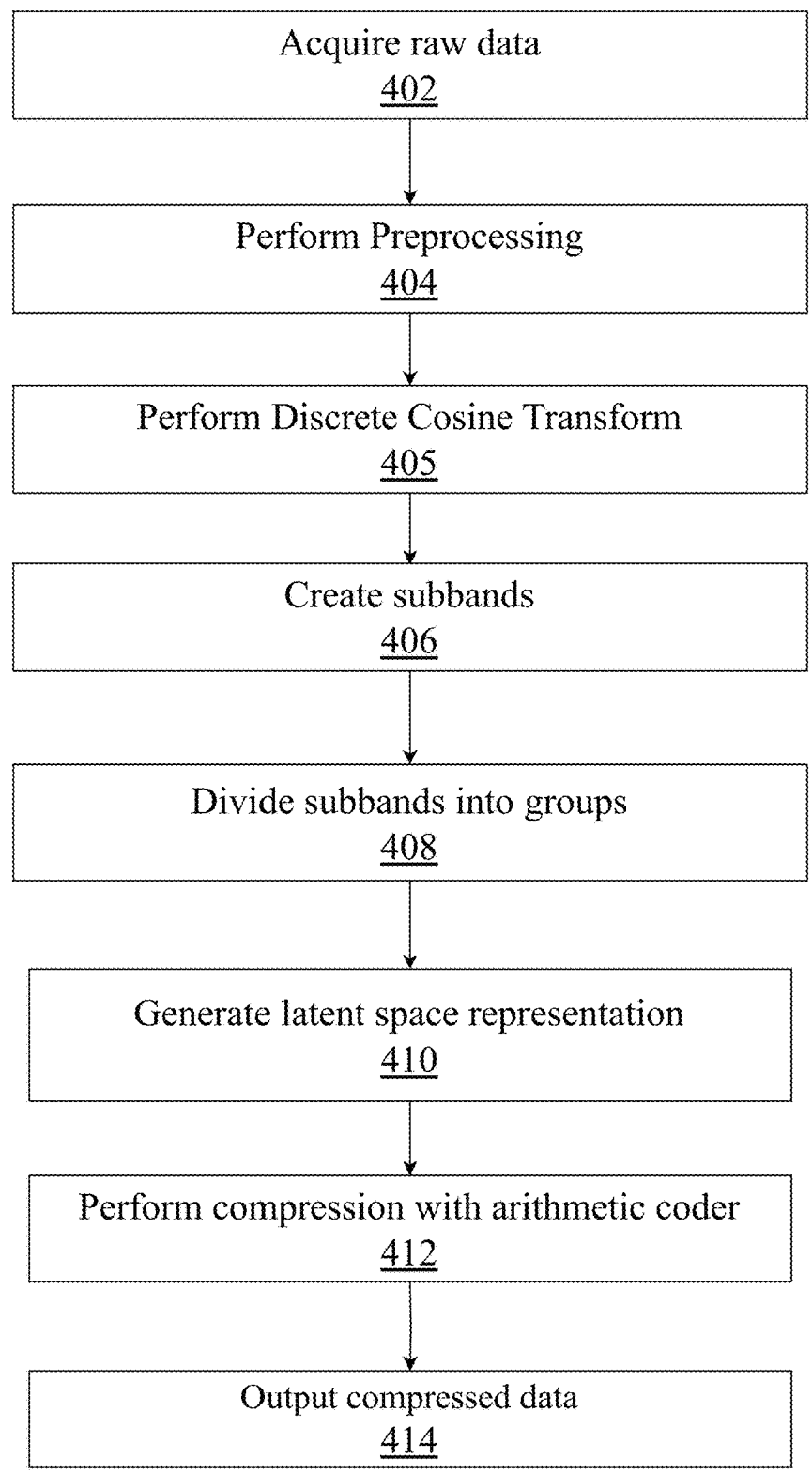
FIG. 4 is a flow diagram illustrating an exemplary method for compressing raw data, according to an embodiment.

FIG. 4 is a flow diagram illustrating an exemplary method 400 for compressing raw (uncompressed and unprocessed) data, according to an embodiment. At block 402, raw data is acquired. The method 400 continues to block 404, where preprocessing is performed. The preprocessing can include filtering, normalization, cleansing, quantization, noise reduction, error correction, and so on. The method 400 continues to block 405, where a discrete cosine transform is performed. The discrete cosine transform can include performing a block-wise tokenization scheme. In embodiments, the discrete cosine transform may be performed utilizing a Discrete Cosine Transform Deblur (DCTD) network. The method 400 continues to block 406, where a plurality of subbands is created. The subbands can include a DC component, as well as multiple AC components of varying frequency ranges. The method 400 continues to block 408, where the subband is divided into groups. In embodiments two or more groups may be created, including one or more low frequency (LF) groups, and one or more high frequency (HF) groups. The method 400 continues with generating a latent space representation 410. In one or more embodiments, the latent space representation may be generated by an autoencoder on a subband basis. Embodiments can include discarding one or more subbands prior to generating the latent space representation. Embodiments can include computing a thumbnail version of the latent space representation. In embodiments, the latent space representation can be generated by a variational autoencoder instead of, or in addition to, an autoencoder. The method 400 continues to block 412, where compression is performed with an arithmetic coder. The arithmetic coder can perform compression of latent space representations on a subband basis. The method 400 continues to block 414, where compressed data that is a compressed version of the raw data acquired at block 402 is output.

Figure 5:
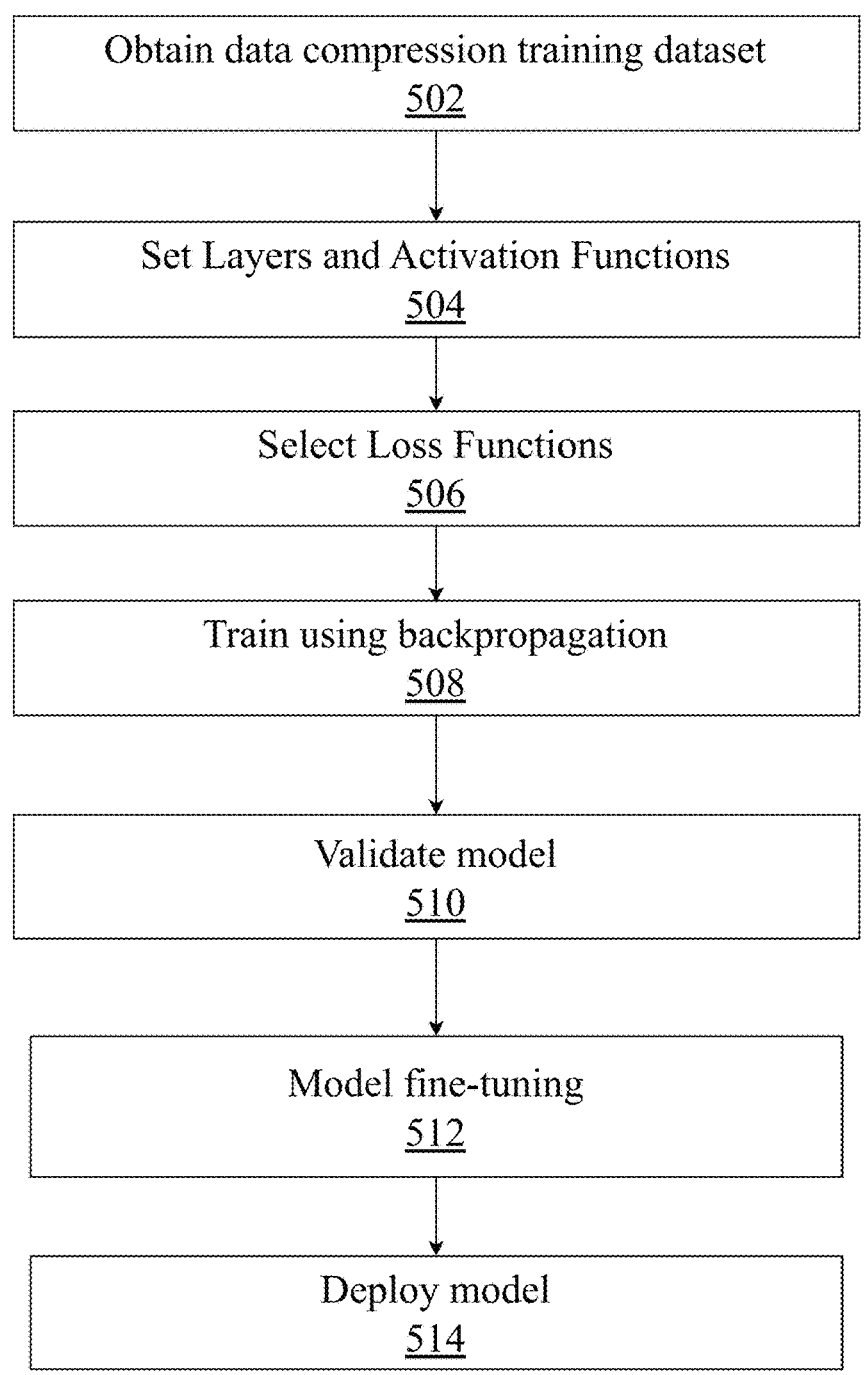
FIG. 5 is a flow diagram illustrating an exemplary method for training a system for compressing and restoring data, according to an embodiment.

FIG. 5 is a flow diagram illustrating an exemplary method for training a system for compressing and restoring data, according to an embodiment. The method 500 starts with obtaining a data compression training dataset at block 502. The data compression training dataset can include multiple samples of representative input data. The method 500 continues with setting layers and activation functions at block 504. In a neural network, layers are the building blocks that form the structure of the network. Each layer comprises a collection of neurons (also called nodes or units), and each neuron performs a specific computation on the input data. The output of one layer becomes the input to the next layer, creating a series of transformations from the input to the output. The layers can include input layers, output layers, and/or hidden layers. The activation functions introduce non-linearity into the model, allowing it to learn and represent complex patterns in the data. In embodiments, the activation functions can include a sigmoid function, a hyperbolic tangent function, a rectified linear unit (ReLU), a Leaky ReLU, softmax function, and/or other suitable activation function. The method 500 continues to block 506 for selecting loss functions. The loss functions are mathematical functions used in machine learning to measure the difference between the predicted values produced by the model and the actual target values from the training data. In one or more embodiments, the loss functions can include Mean Squared Error (MSE), Mean Absolute Error (MAE), Categorical Cross-Entropy, and/or other suitable loss functions. The loss functions can be used to determine if the model is sufficiently trained. The method 500 continues to block 508 for training the model using backpropagation. The backpropagation process can include computing gradients of the loss with respect to the weights and biases in the output layer. These gradients are propagated backward through the neural network to the hidden layer. The method 500 continues to block 510, where the model is validated. The validation can include using an additional set of uncompressed data files that were not part of the training dataset, to serve as a test dataset. The test dataset files can be compressed, reconstructed, and the reconstructed data can be compared with the original input data to confirm proper operation of the model. The method 500 can include model fine-tuning at block 512. The model fine-tuning can include adjusting weights and/or other hyperparameters as needed to improve model output. The method 500 continues to block 514, where the model is deployed for use in its intended application. In this way, disclosed embodiments provide an efficient compression technique for compressing digital data.

Figure 6:
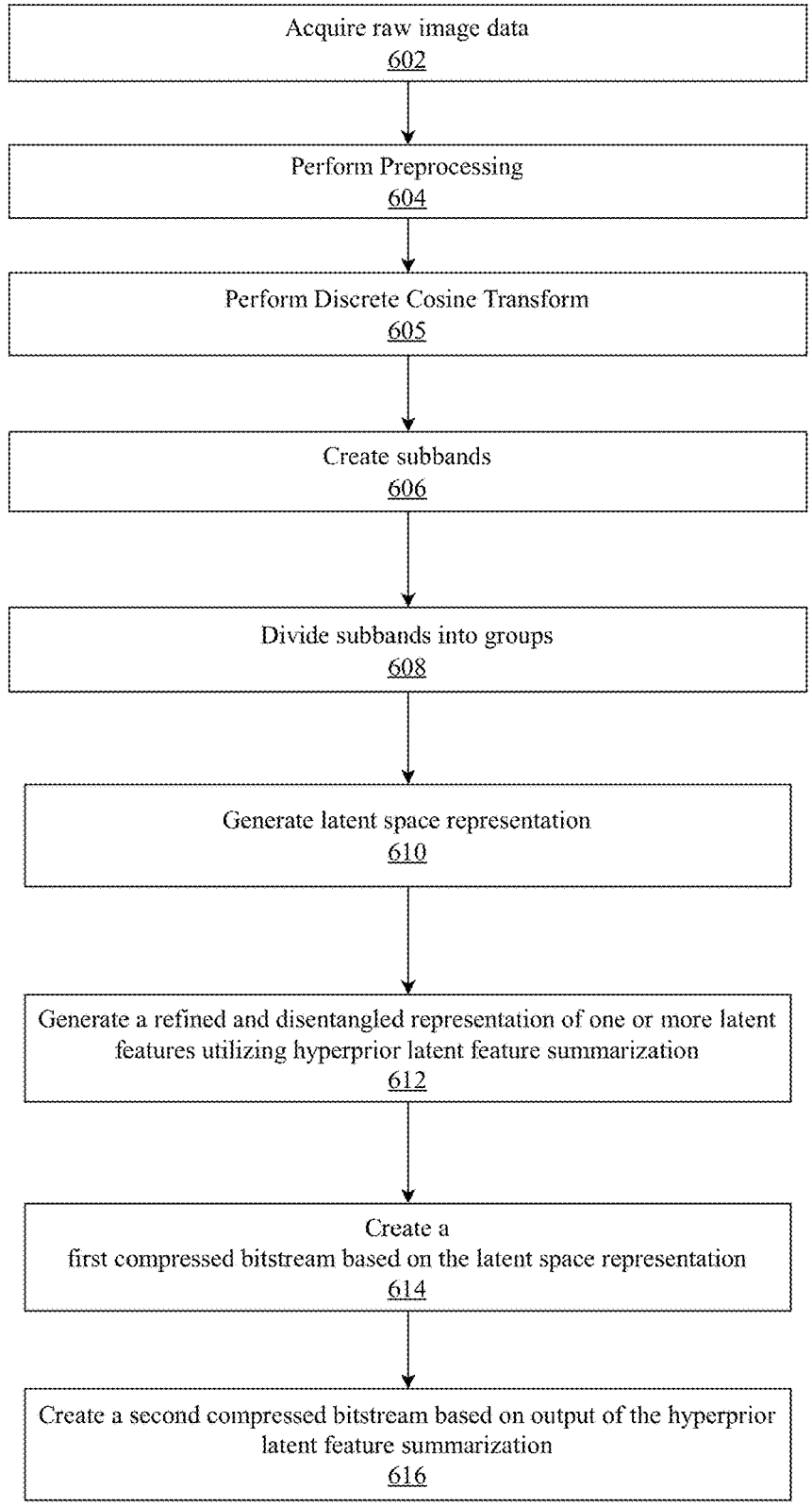
FIG. 6 is a flow diagram illustrating another exemplary method for compressing raw data, according to an embodiment.

FIG. 6 is a flow diagram illustrating another exemplary method for compressing raw data, according to an embodiment. At block 602, raw data is acquired. The method 600 continues to block 604, where preprocessing is performed. The preprocessing can include filtering, normalization, cleansing, quantization, noise reduction, error correction, and so on. Additionally, the preprocessing can include adding metadata to the data (e.g., via prepending a header). The metadata can include location information, date and/or time information, and/or other relevant information. The method 600 continues to block 605, where a discrete cosine transform is performed. The discrete cosine transform can include performing a block-wise tokenization scheme. In embodiments, the discrete cosine transform may be performed utilizing a Discrete Cosine Transform Deblur (DCTD) network. The method 600 continues to block 606, where a plurality of subbands is created. The subbands can include a DC component, as well as multiple AC components of varying frequency ranges. The method 600 continues to block 608, where the subband is divided into groups. In embodiments two or more groups may be created, including one or more low frequency (LF) groups, and one or more high frequency (HF) groups. The method 600 continues with generating a latent space representation 610. In one or more embodiments, the latent space representation may be generated by an autoencoder on a subband basis. Embodiments can include discarding one or more subbands prior to generating the latent space representation. Embodiments can include computing a thumbnail version of the latent space representation. In embodiments, the latent space representation can be generated by a variational autoencoder instead of, or in addition to, an autoencoder. The method 600 continues to block 612, where a refined and disentangled representation of one or more latent features are generated utilizing hyperprior latent feature summarization. The refined and disentangled representation provides latent features that each capture a distinct and independent factor of variation in the data, and can enable generative modeling. Moreover, the refined and disentangled representation of one or more latent features can serve as a form of noise reduction in that unnecessary or irrelevant information is minimized, leading to more robust models. Thus, the refined and disentangled representation can enable improved classification and regression results.

In one or more embodiments, the hyperprior latent feature summarization includes using a secondary latent variable (the hyperprior) to improve the modeling of uncertainty and dependencies in the primary latent features for raw data. In one or more embodiments, the hyperprior latent feature summarization module comprises a Hierarchical Bayesian Network (HBN). The HBN can include a top layer for representing hyperparameters and/or priors. The HBN can include a bottom layer that represents raw data. The HBN can include one or more middle layers for capture of intermediate latent variables. In one or more embodiments, the HBN may be implemented with multiple nodes that are connected by edges, that serve as directed links to indicate causal and/or dependency relationships between nodes.

The method 600 continues to block 614 where a first compressed bitstream based on the latent space representation is created. In one or more embodiments, an arithmetic encoder is used to create the compressed bitstream. The arithmetic encoder can be configured to estimate a probability of a given symbol, and encode frequently occurring symbols with a smaller representation. All symbols are processed, and the assigned value is converted to a binary representation which forms the compressed bitstream. The method 600 continues to block 616, where a second compressed bitstream based on the output of the hyperprior latent feature summarization is created. The second compressed bitstream may be created using an arithmetic encoder in a similar manner to that described for block 614. While the flow diagram illustrated in FIG. 6 shows two compressed bitstreams, in some embodiments, the process may continue with forming additional compressed bitstreams based on subsequently derived latent space representations.

Exemplary Computing Environment

Figure 7:
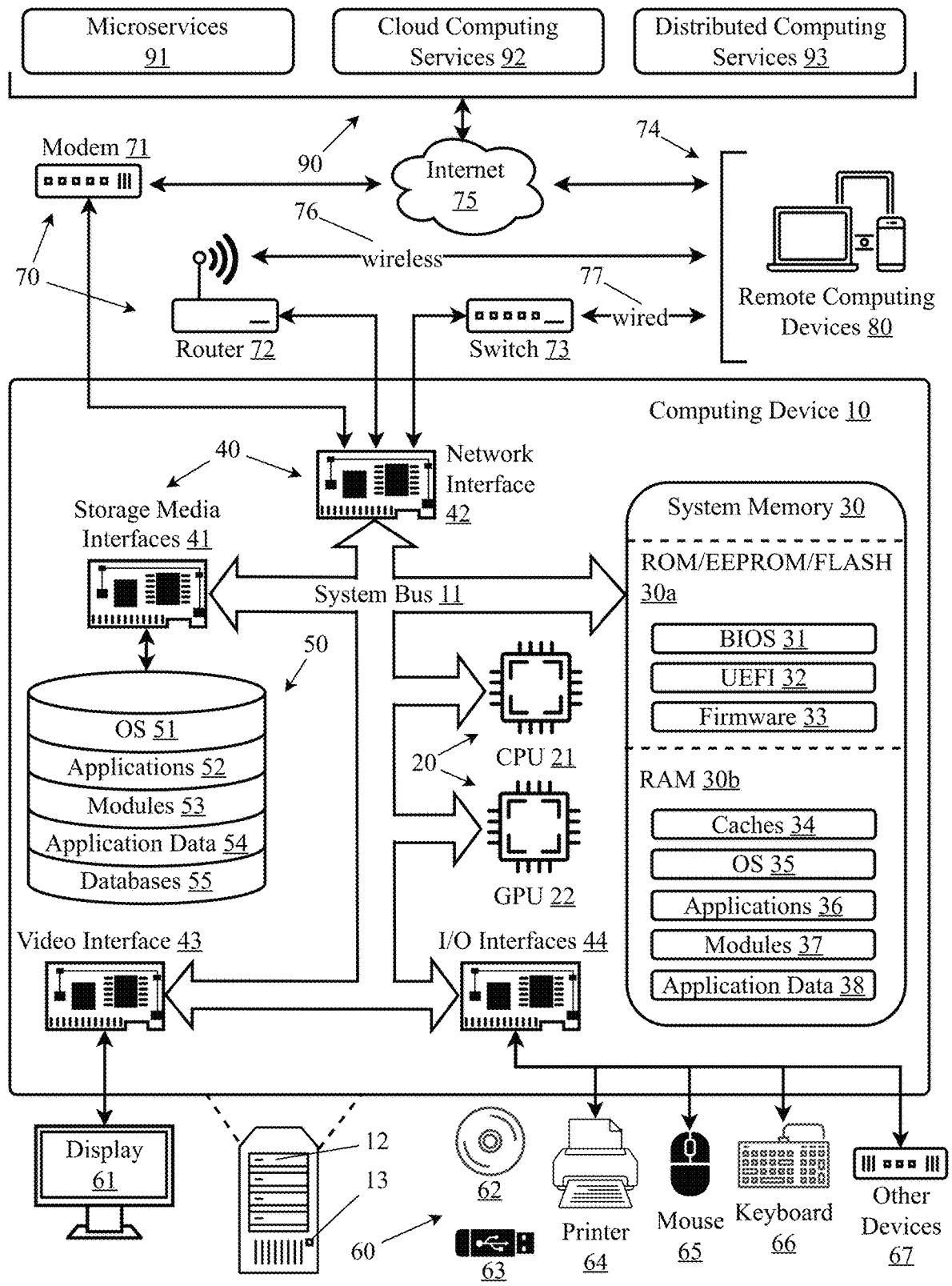
FIG. 7 illustrates an exemplary computing environment on which an embodiment described herein may be implemented, in full or in part.

FIG. 7 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30*a* is not erased when power to the memory is removed, and includes memory types such as read only memory (ROM), electronically-erasable programmable memory (EEPROM), and rewritable solid-state memory (commonly known as "flash memory"). Non-volatile memory 30*a* is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30*a* may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30*b* is erased when power to the memory is removed and is typically used for short-term storage of data for processing. Volatile memory 30*b* includes memory types such as random-access memory (RAM), and is normally the primary operating memory into which the operating system 35, applications 36, program subsystems 37, and application data 38 are loaded for execution by processors 20. Volatile memory 30*b* is generally faster than non-volatile memory 30*a* due to its electrical characteristics and is directly accessible to processors 20 for processing of instructions and data storage and retrieval. Volatile memory 30*b* may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid-state memory technology. Non-volatile data storage devices 50 may store any type of data including, but not limited to, an operating system 51 for providing low-level and mid-level functionality of computing device 10, applications 52 for providing high-level functionality of computing device 10, program subsystems 53 such as containerized programs or applications, or other modular content or modular programming, application data 54, and databases 55 such as relational databases, non-relational databases, object oriented databases, BOSQL databases, and graph databases.

Applications (also known as computer software or software applications) are sets of programming instructions designed to perform specific tasks or provide specific functionality on a computer or other computing devices. Applications are typically written in high-level programming languages such as C++, Java, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible. Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices.

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that makes it possible to package and run applications and their dependencies in isolated environments called containers. One of the most popular containerization platforms is Docker, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containers or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Github Packages or Container registries. Containers can communicate with each other and the external world through networking. Docker provides a bridge network by default, but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, gRPC, or message queues such as Kafka. Microservices 91 can be combined to perform more complex processing tasks.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

As can now be appreciated, disclosed embodiments provide improvements in data compression. Disclosed embodiments provide a subband learning-based compression solution for data compression, which has a divide-and-conquer strategy in dealing with redundancy in data by having a neural network encoder of latent representation, followed by a multi-stage context model that drives an arithmetic coding engine. This enables compressing of data files to reduce their file size, allowing for more efficient use of storage resources. Disclosed embodiments utilize a multiple pass compression scheme, which creates multiple latent spaces for a given input data set, creates bitstreams corresponding to each latent space, and may multiplex each bitstream into a combined bitstream for convenient storage and transmission. Compressed files created by disclosed embodiments require less bandwidth for transmission, making it faster to send and receive data over networks, including satellite links and the internet. Thus, disclosed embodiments enable data to be transmitted more efficiently, promoting important applications such as communications, multimedia streaming, reconnaissance, surveillance, meteorology, and others.

The skilled person will be aware of a range of possible modifications of the various aspects described above. Accordingly, the present invention is defined by the claims and their equivalents.

What is claimed is:

1. A system for data compression, comprising:
   a computing device comprising at least a memory and a processor;
   a preprocessing subsystem comprising a first plurality of programming instructions that, when operating on the processor, cause the computing device to perform one or more preprocessing operations on an uncompressed dataset;
   a discrete cosine transform (DCT) subsystem comprising a second plurality of programming instructions that, when operating on the processor, cause the computing device to:
      perform a DCT operation on the uncompressed dataset, and create a plurality of subbands for the uncompressed dataset, wherein each subband represents a frequency range; and
      divide the plurality of subbands into multiple groups, wherein the multiple groups comprise a first low frequency group, a second low frequency group, and a high frequency group;
   a compression subsystem comprising a third plurality of programming instructions that, when operating on the processor, cause the computing device to implement a latent feature encoding network, wherein the latent feature encoding network comprises:
      a first kernel, the first kernel configured to provide output to a first plurality of residual blocks, the first plurality of residual blocks configured to provide output to a first attention network, the first attention network configured to provide output to a second plurality of residual blocks, the second plurality of residual blocks configured to provide output to a second kernel, and the second kernel configured to provide output to a second attention network, and wherein the latent feature encoding network is configured and disposed to generate a latent space representation corresponding to the uncompressed dataset;
   a first arithmetic coding subsystem comprising a fourth plurality of programming instructions that, when operating on the processor, cause the computing device to perform compression on one or more of the plurality of subbands, thereby creating a first compressed bitstream;

a hyperprior latent feature summarization module configured and disposed to receive input from the second attention network, and provide a refined and disentangled representation of one or more latent features as output; and a second arithmetic coding subsystem comprising a fifth plurality of programming instructions that, when operating on the processor, cause the computing device to perform compression on the output of the hyperprior latent feature summarization module, thereby creating a second compressed bitstream;

wherein the first compressed bitstream and second compressed bitstream together represent a compressed version of the uncompressed dataset.

2. The system of claim 1, wherein the hyperprior latent feature summarization module is configured to compute a thumbnail version of the latent space representation.

3. The system of claim 1, wherein the hyperprior latent feature summarization module comprises a Hierarchical Bayesian Network (HBN).

4. The system of claim 1, wherein the first kernel is configured to have five channels and a stride value of 1.

5. The system of claim 1, wherein the second kernel is configured to have five channels and a stride value of 2.

6. The system of claim 1, wherein the first plurality of residual blocks comprises six residual blocks.

7. The system of claim 1, wherein the second plurality of residual blocks comprises three residual blocks.

8. The system of claim 1, wherein the compression subsystem further causes the processor to discard one or more subbands prior to generating the latent space representation.

9. The system of claim 1, further comprising a bitstream multiplexor, wherein the bitstream multiplexor is configured to receive as input, the first compressed bitstream and the second compressed bitstream, and output a third compressed bitstream, wherein the third compressed bitstream comprises data from the first compressed bitstream and the second compressed bitstream.

10. A method for data compression, comprising:
performing one or more preprocessing operations on an uncompressed dataset;
performing a discrete cosine transform (DCT) operation on the uncompressed dataset, and create a plurality of subbands for the uncompressed dataset, wherein each subband represents a frequency range;
dividing the plurality of subbands into multiple groups, wherein the multiple groups comprise a first low frequency group, a second low frequency group, and a high frequency group;
generating a latent space representation corresponding to the multiple groups;
generating a refined and disentangled representation of one or more latent features utilizing hyperprior latent feature summarization;
creating a first compressed bitstream based on the latent space representation; and
creating a second compressed bitstream based on output of the hyperprior latent feature summarization; wherein the first compressed bitstream and second compressed bitstream together represent a compressed version of the uncompressed dataset.

11. The method of claim 10, wherein the one or more preprocessing operations includes a data normalization process.

12. The method of claim 10, wherein the one or more preprocessing operations includes a quantization process.

13. The method of claim 10, wherein the one or more preprocessing operations includes a noise reduction process.

14. The method of claim 10, wherein the one or more preprocessing operations includes an outlier reduction process.

15. The method of claim 10, further comprising multiplexing the first compressed bitstream and the second compressed bitstream to form a third compressed bitstream.

16. A non-transient, computer-readable medium comprising programming instructions for an electronic computation device executable by a processor to cause the electronic computation device to:
perform one or more preprocessing operations on an uncompressed dataset;
perform a discrete cosine transform (DCT) operation on the uncompressed dataset, and create a plurality of subbands for the uncompressed dataset, wherein each subband represents a frequency range;
divide the plurality of subbands into multiple groups, wherein the multiple groups comprise a first low frequency group, a second low frequency group, and a high frequency group;
generate a latent space representation corresponding to the multiple groups;
generate a refined and disentangled representation of one or more latent features utilizing hyperprior latent feature summarization;
create a first compressed bitstream based on the latent space representation; and
create a second compressed bitstream based on output of the hyperprior latent feature summarization; wherein the first compressed bitstream and second compressed bitstream together represent a compressed version of the uncompressed dataset.

17. The computer-readable medium of claim 16, wherein the computer-readable medium further comprises programming instructions that, when executed by the processor, cause the electronic computation device to perform steps of multiplexing the first compressed bitstream and the second compressed bitstream to form a third compressed bitstream.

18. The computer-readable medium of claim 16, wherein the computer-readable medium further comprises programming instructions that, when executed by the processor, cause the electronic computation device to perform an outliner reduction process as part of the one or more preprocessing operations.

19. The computer-readable medium of claim 16, wherein the computer-readable medium further comprises programming instructions that, when executed by the processor, cause the electronic computation device to perform a data normalization process as part of the one or more preprocessing operations.

20. The computer-readable medium of claim 16, wherein the computer-readable medium further comprises programming instructions that, when executed by the processor, cause the electronic computation device to perform a noise reduction process as part of the one or more preprocessing operations.

* * * * *